(12) United States Patent
Holland et al.

(10) Patent No.: US 8,160,319 B2
(45) Date of Patent: Apr. 17, 2012

(54) REDUCING DISTORTION IN MAGNETIC RESONANCE IMAGES

(75) Inventors: Dominic Holland, La Jolla, CA (US); Anders Dale, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 1006 days.

(21) Appl. No.: 12/152,842

(22) Filed: May 16, 2008

(65) Prior Publication Data

US 2008/0285835 A1 Nov. 20, 2008

Related U.S. Application Data

(60) Provisional application No. 60/938,940, filed on May 18, 2007.

(51) Int. Cl.
*G06K 9/00* (2006.01)
(52) U.S. Cl. .................................. 382/128; 600/410
(58) Field of Classification Search .......... 600/410–435; 382/128, 130, 131
See application file for complete search history.

(56) References Cited

U.S. PATENT DOCUMENTS

2004/0113615 A1* 6/2004 Bammer et al. ............. 324/307

OTHER PUBLICATIONS

Chang H., and Fitzpatrick J.M., "A Technique for Accurate Magnetic Resonance Imaging in the Presence of Field Inhomogeneities," IEEE Trans Med Imaging 11:319-329 (1992).

Christensen et al., "Volumetric Transformation of Brain Anatomy," IEEE Trans. on Med Imag., vol. 16, No. 6, p. 864, Dec. 1997.

Csernansky et al., "Preclinical detection of Alzheimer's disease: hippocampal shape and volume predict dementia onset in the elderly," NeuroImage 25 (2005) 783-792.

Freeborough, et al., "The Boundary Shift Integral: An Accurate and Robust Measure of Cerebral Volume Changes from Registered Repeat MRI," IEEE Trans. on Med Imag., vol. 16, No. 5, p. 623, Oct. 1997.

Morgan P., et al., "Correction of Spatial Distortion in EPI due to Inhomogeneous Static Magnetic Fields using the Reversed Gradient Method," J Man Reason Imaging 19:499-507 (2004).

* cited by examiner

*Primary Examiner* — Hoon Song
(74) *Attorney, Agent, or Firm* — Perkins Coie LLP

(57) ABSTRACT

Systems and techniques for reducing distortions in magnetic resonance images. In one aspect, machine-implemented method for reducing image distortion in magnetic resonance imaging (MRI) includes receiving a first MRI image and a second MRI image, estimating displacements of voxels between the first MRI image and the second MRI image by minimizing a cost function expressing a cost of the displacements, reducing distortion in an MRI image using the estimated displacements, and making the MRI image having reduced distortion available. The first MRI image and the second MRI image were acquired using different gradient fields.

20 Claims, 6 Drawing Sheets
(2 of 6 Drawing Sheet(s) Filed in Color)

REDUCING DISTORTION IN MAGNETIC RESONANCE IMAGES

CROSS-REFERENCE TO RELATED APPLICATIONS

This application claims priority to U.S. Provisional Application Ser. No. 60/938,940, filed on May 18, 2007, the contents of which are incorporated herein by reference.

FEDERALLY SPONSORED RESEARCH OR DEVELOPMENT

This invention was made with government support under Grant Nos. 7R01AG022381-03 and 1U01AG024904-02 awarded by the National Institutes of Health. The government has certain rights in this invention.

BACKGROUND

This disclosure relates to reducing distortion in magnetic resonance images.

Magnetic resonance imaging (MRI) has been widely applied in medical, biological, and other fields. Typically, MRI produces an image of a part of an object under examination by manipulating the magnetic spins and processing measured responses from the magnetic spins. An MRI system can include hardware to generate different magnetic fields for imaging, including a static magnetic field along a z-direction to polarize the magnetic spins and gradient fields along mutually orthogonal x, y, or z directions to spatially select a body part for imaging, as well as hardware to generate a radiofrequency (RF) field to manipulate the spins. An MRI system can also include a data processing device for filtering, displaying, and otherwise manipulating the generated data.

Actual magnetic fields in real-world MRI systems, including the static magnetic field ($B_0$) and gradient fields, deviate from ideal. Such deviations can cause distortions in the acquired MRI images. For example, a static magnetic field ($B_0$) may be spatially inhomogeneous and gradient fields may have nonlinearities in their gradients. The distortions caused by such imperfections can limit the accuracy and usefulness in detecting certain conditions in brain and other tissue. For example, MRI images acquired by the high-speed Echo Planar Imaging (EPI) can suffer sever distortions caused by imperfections in applied fields. Hence, it is desirable to reduce such field-induced distortions.

In an article entitled "A Technique for Accurate Magnetic Resonance Imaging in the Presence of Field Inhomogeneities," (IEEE Trans. Med. Imaging, Vol. 11, p. 319-329 (1992), the contents of which are incorporated herein by reference), Chang and Fitzpatrick assert that the correct, undistorted MRI image lies midway between two MRI images produced using magnetic fields with opposite gradients of the same magnitude.

Because of its ultra-fast imaging speed and relatively good image definition, Blipped Echo Planar Imaging (EPI) is the pulse sequence of choice for diffusion and perfusion imaging, functional MRI (fMRI), cardiac imaging, and abdominal imaging. However, because inhomogeneous static magnetic field-induced distortions in, for example, a 3T scanner can easily be a centimeter or more near an air-tissue boundary such as the sinuses, the utility of EPI is reduced.

Morgan et al. have proposed a technique to reduce such magnetic field distortions in Blipped Echo Planar Imaging (EPI). See "Correction of Spatial Distortion in EPI Due to Inhomogenous Static Magnetic Fields Using the Reversed Gradient Method," J. Magn. Reson. Imaging Vol. 19, p. 499-507 (2004), the contents of which are incorporated herein by reference. It is believed that this technique does not accurately reflect continuous and smooth image distortions caused by generally continuous and smooth magnetic field distortions, as discussed further below.

SUMMARY

The present inventors have developed systems and techniques, including machine-readable instructions that can be followed by data processing devices, for reducing distortions in magnetic resonance images.

In one aspect, a machine-implemented method for reducing image distortion in magnetic resonance imaging (MRI) is described. The method includes receiving a first MRI image and a second MRI image, estimating displacements of voxels between the first MRI image and the second MRI image by minimizing a cost function expressing a cost of the displacements, reducing distortion in an MRI image using the estimated displacements, and making the MRI image having reduced distortion available. The first MRI image and the second MRI image were acquired using different gradient fields.

This and other aspects can include one or more of the following features. Estimating the displacements of the voxels can include iteratively minimizing a collection of cost functions expressing costs of displacements of different versions of the first MRI image and the second MRI image, wherein the different versions have been smoothed to different extents. Estimating the displacements of the voxels can include producing a Hessian of the cost function and perturbing the Hessian of the cost function around a current estimate of the displacements using sparse matrix techniques. Estimating the displacements of the voxels can include minimizing $$F(u_1, \ldots, u_N) = \frac{1}{N}\sum_{i=1}^{N}[J_{1i}I_1(\vec{r}+u_i\hat{y}) - J_{2i}I_2(\vec{r}-u_i\hat{y})]^2 + \lambda_1 \sum_{i=1}^{N} u_i^2 + \lambda_2 \sum_{i=1}^{N}[\vec{\nabla}_i u_i]^2.$$

Reducing the distortion in the MRI image can include reducing the distortion in the first MRI image or in the second MRI image. Making the MRI image having reduced distortion available can include physically transforming a display screen to display the MRI image having reduced distortion or physically transforming a memory element in a data storage device to store data describing the MRI image having reduced distortion.

The cost function can include a data term that that reflects a match between predicted and observed values of voxel coordinates and a regularization part that reflects the physical properties of a magnetic field.

In another aspect, an article can include one or more machine-readable media storing instructions operable to cause one or more machines to perform operations. The operations can include estimating displacements of voxels between a forward gradient MRI image and a reverse gradient MRI image by finding an extremum of an expression that is a function of the displacements.

This and other aspects can include one or more of the following features. The extremum can be found using sparse matrix techniques. The extremuin can be found by perturbing a Hessian of a cost function that expresses a cost of the displacements of the voxels. The Hessian of the cost function can be the Hessian of quadratic approximation of the cost function.

The displacements of the voxels can be estimated by smoothing the forward gradient MRI image and the reverse gradient MRI image to reduce high spatial frequency content. The expression can be a function of the displacements of the voxels between the smoothed forward gradient MRI image and the smoothed reverse gradient MRI image.

The expression can be $H(\vec{u}) \cdot \vec{v} = -\vec{g}(\vec{u})$, where $H(\vec{u})$ is the Hessian of a cost function at $\vec{u}$, and $\vec{g}(\vec{u})$ is the gradient of the cost function at $\vec{u}$.

In another aspect, a machine-implemented method can include smoothing MRI images to yield first smoothed MRI images, expressing a cost of displacements of voxels in the first smoothed MRI images in a first expression, perturbing the first expression to yield a first approximation of the displacements of the voxels, smoothing the MRI images to yield second smoothed MRI images, wherein the second smoothed MRI images include higher spatial frequency content than the first smoothed MRI images, expressing a cost of the displacements of voxels in the second smoothed MRI images in a second expression, and perturbing the second expression about the first approximation to yield a second approximation of the displacements of the voxels.

In another aspect, a machine-implemented method for magnetic resonance imaging (MRI) can include using data from acquired raw MRI images with opposite-gradient magnetic fields to construct a cost function for an MRI displacement field caused by applied magnetic fields in acquiring the raw MRI images, the cost function comprising: (1) a term involving the voxel-by-voxel difference of image intensities, which are scaled by the local dilation; (2) a term to keep the MRI displacement field smooth over the whole volume; and (3) a scale term for the MRI displacement field, and minimizing the cost function to extract correct MRI displacement for each voxel.

This and other aspects can include one or more of the following features. The MRI displacement field can be used to construct an MRI image with reduced image distortions. The cost function can be minimized by applying a convolution processing to smooth the images, applying Newton's method to the cost function of the smoothed images to construct a matrix equation as the Hessian of the cost function, and processing the matrix equation to find a solution for the MRI displacement field which corrects the distortions and aligns the images) at a current level of smoothing. The minimizing of the cost function can be iterated at different levels of smoothing to obtain the displacement field.

Different implementations of the described systems and techniques can recognize different advantages. For example, in some implementations, MRI images can be processed to obtain the displacements of individual voxels. These individual voxel displacements can be used to form MRI images with reduced distortion due to deviations in from ideality in magnetic fields used to acquire the images.

Moreover, many magnetic field deviations arise due to magnetic fields induced in the subject being imaged and thus depend on the shape and tissue boundaries of that individual subject. The described systems and techniques can reduce these individual deviations on a case-by-case basis.

The described systems and techniques can be also used in arenas where subtle changes may be clinically relevant and hence image distortions are particularly insidious. Examples include Alzheimer's disease and Parkinson's disease, where the structural changes in an individual's brain can be subtle even over relatively long times and difficult to discern in the presence of distortions.

In some implementations, the described systems and techniques can be used to accurately reduce distortions in high-speed MRI scans that take, e.g., about a minute per scan. Deformation fields (i.e., the three-dimensional displacement of voxels in an MRI image) can be determined quickly (e.g., in less than 3 minutes). The described systems and techniques can thus be used in clinical settings, e.g., to accurately calculate the volume change of any region of interest and assess whether a pathological change has occurred.

In some implementations, a determination of the deformation field using the described systems and techniques does not depend on a definition or location of tissue boundaries. Such determinations of the deformation field are thus objective and less subject to operator or other error.

In some implementations, the described systems and techniques can reduce image distortion without the acquisition of two phase images at two different echo times. The acquisition of such phase images can add to scan times. This is advantageous since, in general, the longer the scan time, the greater the chance of motion-related data corruption. Indeed, in some implementations, the described systems and techniques can be implemented using a single forward and reverse scan that are acquired together as a single pulse sequence and add only a short time (e.g., 20-30 seconds) to a scan.

In some implementations, forward and reverse scans can be post-processed immediately following acquisition to yield a treated image. Such processing can be performed quickly, e.g., in minutes.

In some implementations, a displacement field, once calculated, can be applied to a subsequent series of images. For example, a displacement field that is calculated for sharper images can be applied to blurrier ones. In some implementations, the displacement field can be calculated for images acquired using one technique (such as, e.g., spin-echo EPI) but used to reduce distortion in images acquired using a second technique (such as, e.g., gradient-echo EPI).

The details of one or more implementations are set forth in the accompanying drawings and the description below. Other features and advantages will be apparent from the description and drawings, and from the claims.

DESCRIPTION OF DRAWINGS

The patent or application file contains at least one drawing executed in color. Copies of this patent or patent application publication with color drawing(s) will be provided by the Office upon request and payment of the necessary fee.

Like reference symbols in the various drawings indicate like elements.

DETAILED DESCRIPTION

Figure 1:
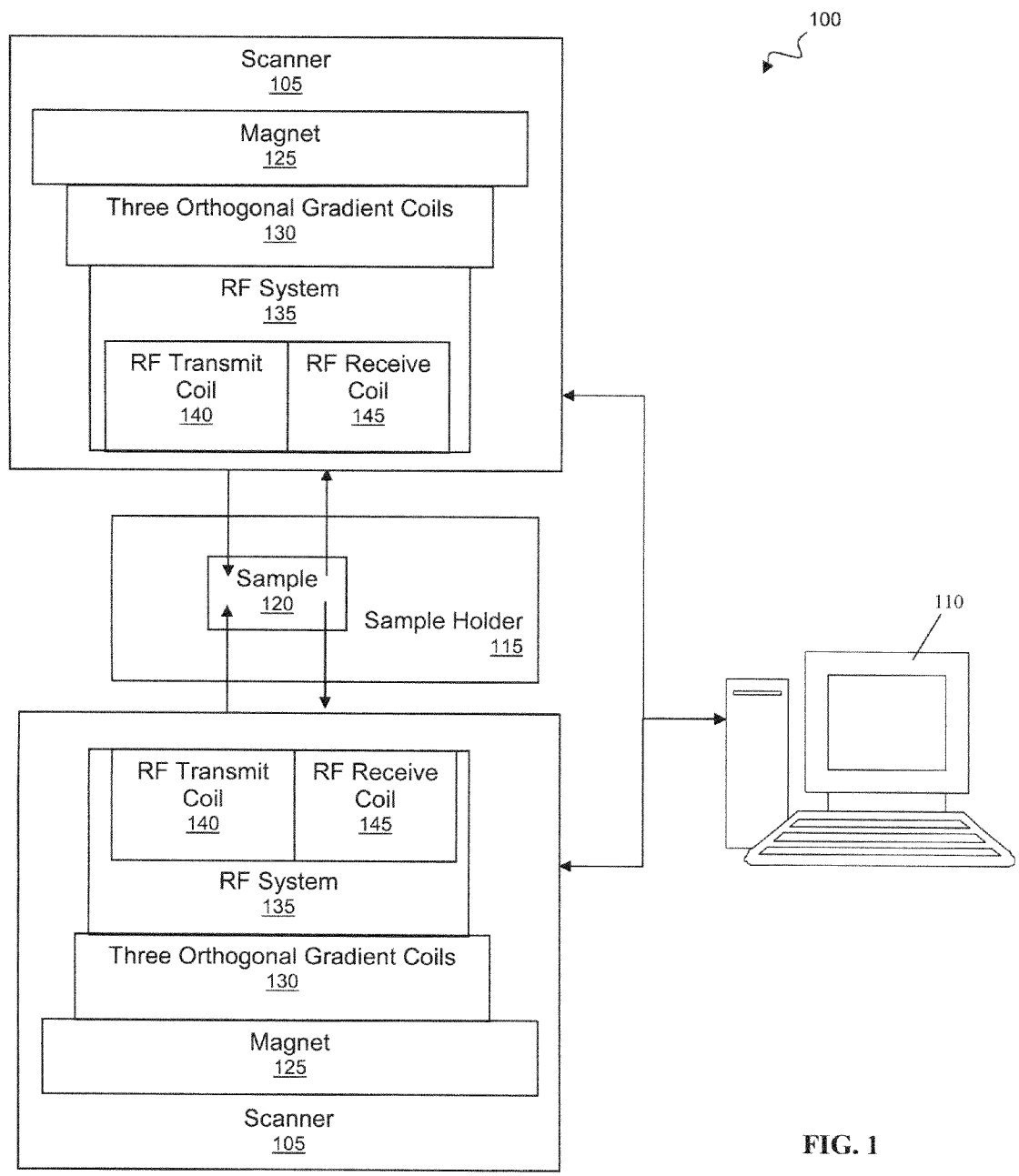
FIG. 1 is a schematic representation of an MRI system.

FIG. 1 is a schematic representation of an MRI system 100. MRI system 100 is a device for magnetic resonance imaging. For example, MRI system 100 can be an MRI scanner such as a 1.5T Sigma TwinSpeed scanner (available from GE Healthcare Technologies, Milwaukee, Wis.).

MRI system 100 includes a scanner 105, a data processing apparatus 110 and a sample holder or table 115 for holding a sample 120. Scanner 105 includes a main magnet 125, three orthogonal gradient coils 130, and a RF system 135. Main magnet 125 is designed to provide a constant, homogeneous magnetic field. Orthogonal gradient coils 130 are designed to provide three orthogonal, controllable magnetic gradients used to acquire image data of a desired slice by generating an encoded and slice-selective magnetic field.

RF system 135 includes an RF transmit coil 140 and an RF receive coil 145 designed to transmit and receive RF pulses, respectively. RF system 135 can also include an RF synthesizer and a power amplifier (not shown). In some implementations, an integrated transceiver coil (not shown) can be used in place of transmit coil 140 and receive coil 145. For example, a close-fitting smaller coil can improve image quality when a small region is being imaged. Further, depending on the sample and imaging applications, various types of coils that are placed around specific parts of a body (e.g., the head, knee, wrist, etc.) or even internally can be used.

Data processing apparatus 110 is one or more devices for performing operations in accordance with the logic of one or more sets of machine-readable instructions. The instructions can be tangibly embodied in hardware, software, or in combinations of the two. Further detail regarding data processing apparatus 110, and other data processing devices, are provided below.

Figure 2:
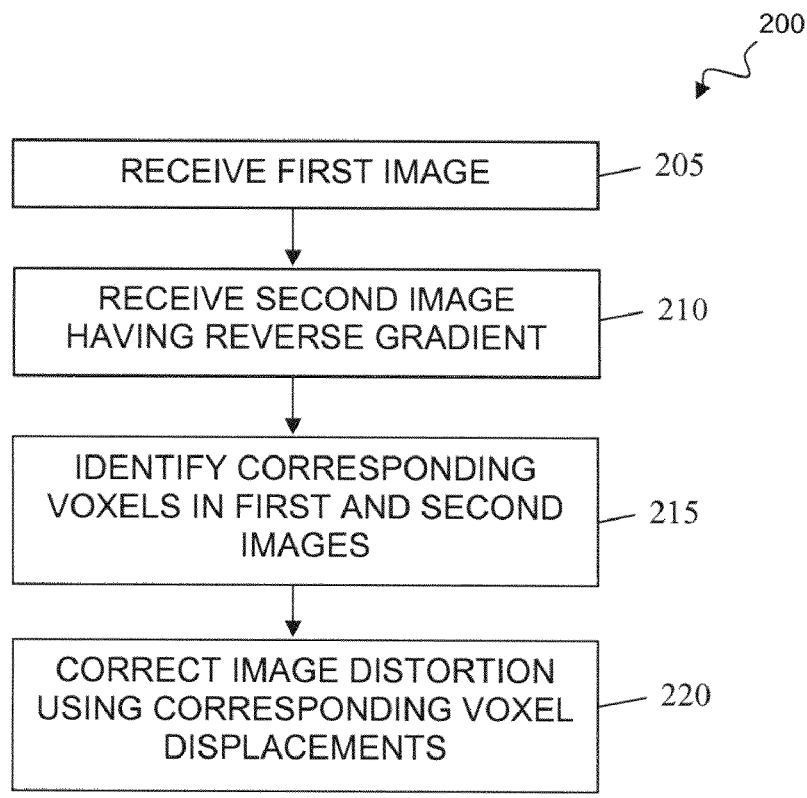
FIGS. 2-4 are flowcharts of processes for reducing distortion in MRI images.

FIG. 2 is a flowchart of a process 200 for reducing distortion in MRI images. Process 200 can be performed by one or more devices for performing operations in accordance with the logic of one or more sets of machine-readable instructions. For example, process 200 can be performed by data processing apparatus 110 (FIG. 1).

The system performing process 200 can receive a first image at 205 and a second image at 210. The images can be received as data in machine-readable format. The second image can have been acquired with a magnetic field gradient that is reversed relative to the magnetic field gradient with which the first image was acquired. The first image can thus be referred to as the "forward gradient image," whereas the second image can be referred to as the "reverse gradient image."

The system performing process 200 can also identify corresponding voxels in the first and second images at 215. The corresponding voxels can be found at the anatomical locations that are almost the same (generally, with sub-voxel differences in position) in the first and second images. The corresponding voxels can have related intensities in the sense that any increase in intensity due to expansion of the voxel in one image corresponds with a decrease in intensity due to compression of the voxel in the other image.

The system performing process 200 can also reduce image distortion using the displacements between corresponding voxels in the first and second images at 220. For example, as discussed above, Chang and Fitzpatrick have asserted that undistorted MRI image lies midway between two MRI images produced using magnetic fields with opposite gradients. If the first and second image are such oppositely-distorted MRI images, then the image distortion can be reduced using their approach.

Figure 3:
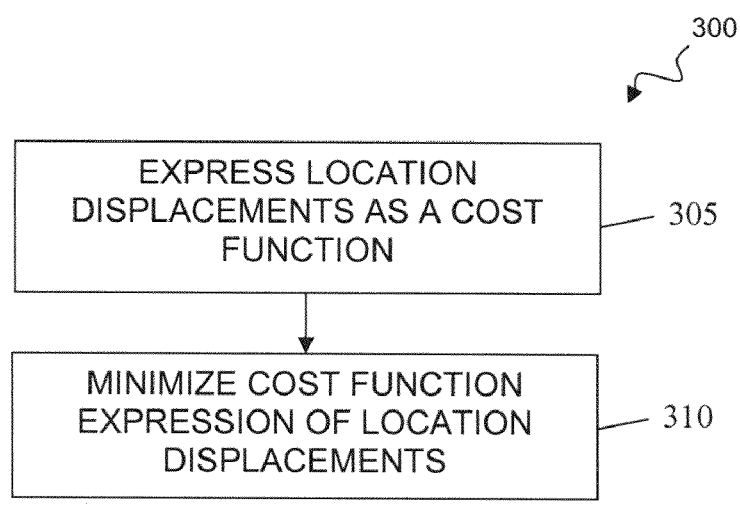

FIG. 3 is a flowchart of a process 300 for reducing distortion in MRI images. In particular, process 300 is a process for identifying corresponding voxels with matching intensities in first and second MRI images. Process 300 can be performed alone or in conjunction with other activities. For example, process 300 can be performed at 215 in process 200 (FIG. 2).

The system performing process 300 can express the displacement in location of corresponding voxels as a cost function at 305. For example, in one implementation, $\hat{y}$ is the phase encoding axis, G is the average phase encoding gradient amplitude during each phase encoding period $\tau$, and T is the length of time between the start of each frequency-encoding or readout line ($T = N_x t + \tau$, where $N_x$ is the number of readout sampling points, each separated in time by t). If $\Delta B(x, y, z)$ is the inhomogeneity in the magnetic field, then, ignoring the two-to-three orders of magnitude smaller shifts along the slice-select and readout directions, the signal emanating from location (x, y, z) will be shifted to (x, y+u, z), where $$u(x, y, z) = \left(\frac{T}{\tau}\right)\frac{\Delta B(x, y, z)}{G} \qquad \text{Equation 1}$$

The signal emanating from location (x, y, z) will be proportional to the spin density. Thus, if distortion leads to local compression the signal will be higher by the amount of compression. Suppressing x and z, the signal emanating from location (x, y, z) will be scaled by the Jacobian J of the transformation $y \rightarrow y' = y + u(y)$:

$$J = 1 + \frac{\partial u(y)}{\partial y} = 1 + \frac{T/\tau}{G}\frac{\partial \Delta B}{\partial y} \qquad \text{Equation 2}$$

If the phase-encoding gradient is reversed, i.e., k-space is traversed in the opposite direction along the phase-encoding axis, and a second image acquired, the signal emanating from location (x, y, z) will be shifted to (x, y−u, z).

Using this information, a merit or cost function can be constructed. That is, if there are N voxels, where the center of voxel i in the undistorted image is indexed by the voxel integers $\vec{r}_i = (x_i, y_i, z_i)$, then the correct displacement field $u(\vec{r}) \equiv \{u_i = u(x_i, y_i, z_i); i=1, \ldots, N\}$ giving for each i the location of $(x_i, y_i, z_i)$ in the distorted images can be found as the minimizing vector of variables of a suitable cost function.

In particular, let $I_1$ denote a forward gradient image that is acquired traversing k-space in the positive $\hat{y}$-direction, and $I_2$ the oppositely-distorted reverse gradient image acquired traversing in the negative $\hat{y}$-direction. Let I denote the true undistorted image. The center of voxel i will have intensity $I(x_i, y_i, z_i)$. In the forward gradient image $I_1$, the center of voxel i will appear at voxel location $(x_i, y_i + u_i, z_i)$. In the reverse gradient image $I_2$, the center of voxel i will appear at voxel location $(x_i, y_i - u_i, z_i)$.

In image I, the neighboring voxel on the $+\hat{y}$ side of voxel i can be denoted $i_p$ and the neighboring voxel on the $-\hat{y}$ side can be denoted $i_m$. The displacements of their centers, giving their voxel coordinates in the forward image, can be denoted $u_{ip}$ and $u_{im}$, respectively. Then, $$I(\vec{r}) = J_{1i} I_1(\vec{r} + u_i \hat{y}) = J_{2i} I_2(\vec{r} - u_i \hat{y}) \qquad \text{Equation 3}$$

where $J_{1i}$ is estimated from a discrete version of Equation 2 in voxel space, namely, $$J_{1i} = 1 + \frac{u_{ip} - u_{im}}{2} \qquad \text{Equation 4}$$

and $$J_{2i} = 1 + \frac{u_{ip} - u_{im}}{2} \qquad \text{Equation 5}$$

Thus, a useful convex merit function can be constructed from:

$$F(u_1, \ldots, u_N) = \frac{1}{N}\sum_{i=1}^{N}[J_{1i} I_1(\vec{r} + u_i \hat{y}) - J_{2i} I_2(\vec{r} - u_i \hat{y})]^2 \qquad \text{Equation 6}$$

which vanishes by design when all displacements correctly unwarp both images to make each identical to the true undistorted image. That is, when the correct displacement field is found, the undistorted image I is given for all voxels i by Equation 3.

The system can be constrained and regularized to keep the deformation field $u(\vec{r})$ smooth. The magnetic field within the brain will vary smoothly, but Equation 1 does not imply y' is a monotonic function of y. Instead, depending on ΔB, for a given pulse sequence fold-over is possible. However, if there is fold-over at (x, y+u, z) in the forward gradient image, there will be magnification (or expansion) in the reverse image at (x, y−u, z), where u is the true displacement.

The formulation in Equation 6 makes correct modeling of fold-over difficult, since the Jacobians would become negative. Equation 6 also assumes a one-to-one mapping from the true undistorted image to the forward (and reverse) image. Mappings that are non-injective (many-to-one) are also possible. In any case, given the forward and reverse images, Equation 6 will allow for a smooth deformation field to be found that will be accurate outside of regions of fold-over and keep small fold-over regions well behaved. This is important since, in practical terms, the inventors have found that fold-over is insignificant in the brain even at 3T.

The interface of a region of one magnetic susceptibility with a region of a different magnetic susceptibility causes local field variation when an external field is applied. The magnetic field at any point is the component parallel to the main field. Though this field will vary smoothly within a region of uniform susceptibility, it need not vary smoothly when traversing a boundary into a region of different susceptibility. Instead, refraction of the magnetic field lines occurs at the interface. Maxwell's equation requires only that the magnetic field component normal to the interface be continuous across the interface. When imaging the head, this refraction is significant only when the other medium is air and, to a much lesser extent, bone. In both cases, there is essentially no MRI signal in the other medium. In air the proton density is practically zero. In bone, transverse relaxation is very fast compared to soft tissue. Thus, although discontinuities in the magnetic field variation will generally exist in the head, they are largely negligible. Hence, it is reasonable to solve for a smoothly varying displacement field.

A smooth varying deformation field can be obtained by controlling the sum of the squares of the gradients of the displacements at each voxel. One can also add a term constraining the amplitude of the displacements. Hence, including the driving term Equation 6, a suitable cost function F that expresses a cost of the displacements is:

$$F(u_1, \ldots, u_N) = \frac{1}{N}\sum_{i=1}^{N} [J_{1i}I_1(\vec{r} + u_i\hat{y}) - J_{2i}I_2(\vec{r} - u_i\hat{y})]^2 + \lambda_1 \sum_{i=1}^{N} u_i^2 + \lambda_2 \sum_{i=1}^{N} [\vec{\nabla}_i u_i]^2$$

Equation 7 where $\lambda_1$ and $\lambda_2$ are regularization parameters of the model that control the quality of the unwarping. The parameters $\lambda_1$ and $\lambda_2$ will generally have a range of valid values that depends on the scale of intensities. For example, in one implementation with 1.5T images, intensities ranged from 0 to 8000 on an arbitrary scale, $\lambda_1$ was set to zero, and $\lambda_2$ was set to $10^4$.

Cost function F in Equation 7 thus includes a data term that reflects the match between predicted and observed values, i.e., $$\frac{1}{N}\sum_{i=1}^{N} [J_{1i}I_1(\vec{r} + u_i\hat{y}) - J_{2i}I_2(\vec{r} - u_i\hat{y})]^2$$

and a regularization part, i.e., $$\lambda_2 \sum_{i=1}^{N} [\vec{\nabla}_i u_i]^2$$

that reflects the physical properties of the field. The data term goes to zero as cost function F is minimized There are other possible variations on this cost function. In some implementations, higher powers could be used or a smoothing term could be appended to explicitly take into account neighboring displacements. For example, in the notation of Equation 4, the term $$\lfloor (u_{ip} - u_i)^2 + (u_i - u_{im})^2 \rfloor$$

could be added, though in practice it behaves similarly to the regularization term in Equation 7 (i.e., the last term in Equation 7). In some implementation, the term other regularization terms can be used.

Returning to FIG. 3, such a cost function can then be minimized at 310 to identify corresponding voxels with matching intensities in first and second MRI images.

Figure 4:
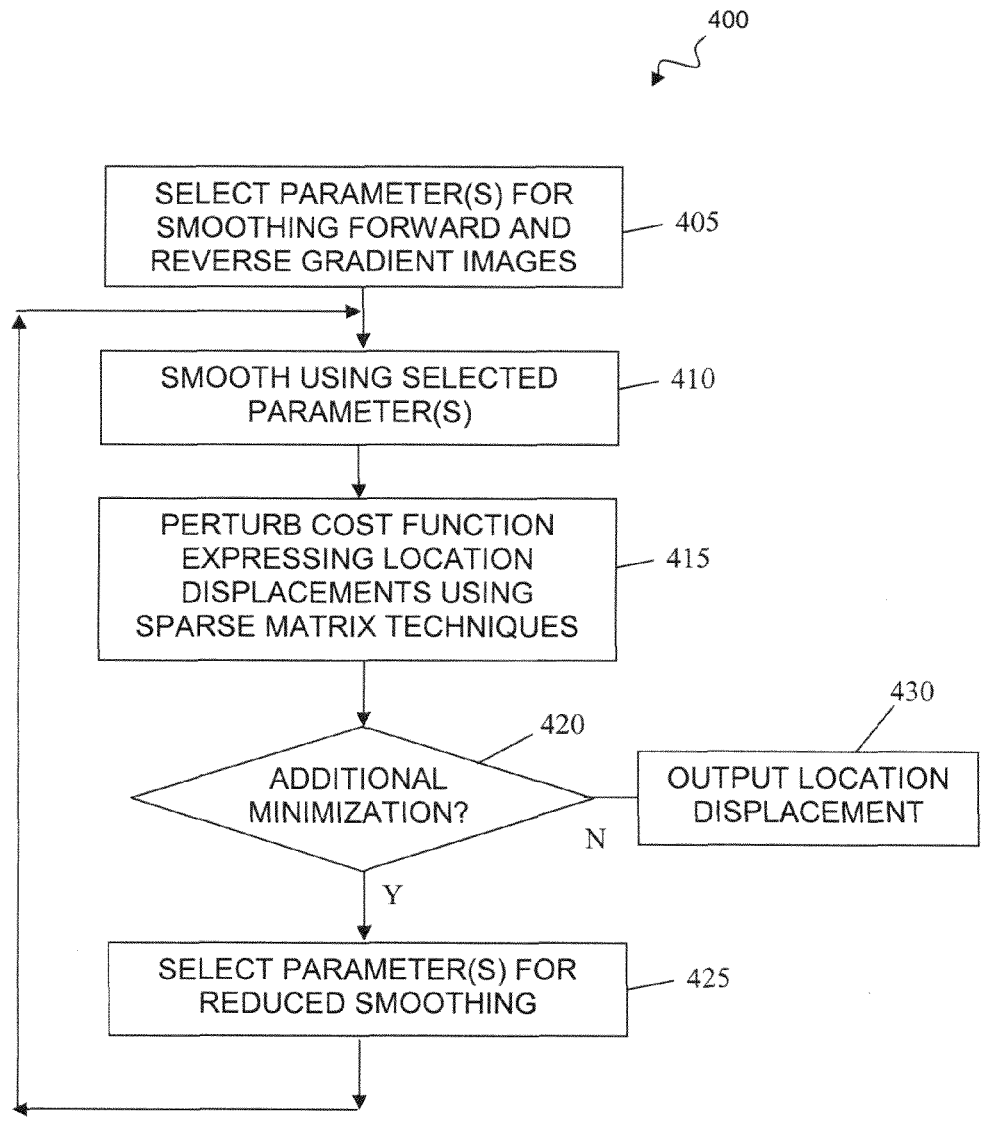

FIG. 4 is a flowchart of a process 400 for reducing distortion in MRI images. In particular, process 400 is a process for minimizing a cost function that expresses a cost of the displacements. Process 400 can be performed alone or in conjunction with other activities. For example, process 400 can be performed at 310 in process 300 (FIG. 3).

The system performing process 400 can select one or more parameters for smoothing forward and reverse gradient images at 405. The amount of smoothing can be selected based on the magnitude of the static magnetic field used to acquire the images. In general, the amount of smoothing is higher as the magnitude of the static magnetic field increases. In some implementations, the forward and reverse gradient images can initially be smoothed by convolution with an isotropic Gaussian kernel having a standard deviation in the range of approximately 3-4 mm.

The system performing process 400 can smooth the forward and reverse gradient images using the selected parameters at 410. Smoothing gradient images reduces the high spatial frequency (small pitch) content, including noise, of the gradient images and can facilitate a minimization of the cost function. For example, in many instances, the number and size of local minima in a cost function will be reduced by smoothing the forward and reverse gradient images.

A minimization carried out at any level of image smoothing can take into account as much gradient information as is available, e.g. as conjugate directions in a second-order Newton's method. A first-order Newton's method using conjugate gradients is stable and accurate, but rather slow. At the other extreme is steepest descent, where only the steepest gradient direction is used, requiring the next step to be orthogonal.

The system performing process 400 can perturb a cost function that expresses location displacements using sparse matrix techniques at 415. For example, in implementations with enough smoothing of the forward and reverse gradient images, the cost function F of Equation 7 is a concave basin that can be approximated using a second-order Taylor expansion. Such a quadratic form approximation of cost function F can be perturbed around a current best estimate $\vec{u}=(u_1, u_2, \ldots, u_N)$ of the displacement vector as a large, sparse, and symmetric linear algebra problem $$H(\vec{u})\cdot\vec{v} = -\vec{g}(\vec{u})$$

Equation 8 where $H(\vec{u})$ is the Hessian of F at $\vec{u}$ and $\vec{g}(\vec{u})$ is the gradient of F at $\vec{u}$. The unknown quantity $\vec{v}=(v_1, v_2, \ldots, v_N)$ is the displacement around $\vec{u}$ that nudges F toward the new global minimum $\vec{u}+\vec{v}$ at the present level of smoothing. The sparseness of this formulation results from coupling only neighboring voxels through the derivative terms in H. The smoothing term couples nearest neighbors and those terms involving the Jacobians will couple second neighbors.

In some implementations, the solution $H(\vec{u})$ in Equation 8 can be found using method such as conjugate gradients squared (CGS), generalized minimum residuals (GMRES), biconjugate gradients stabilized method (Bi-CGSTAB). A computer code kernel for producing $\vec{v}$ from the cost function F is provided below in Annex A. Annex A contains material which is subject to copyright protection. The copyright owner has no objection to the facsimile reproduction by anyone of this document as it appears in the Patent and Trademark Office patent file or records but otherwise reserves all copyright rights.

The system performing process 400 can determine if additional minimization of the cost function is desired at 420. For example, in some implementations, the change in the cost function minimum at the previous two levels of smoothing can be compared to a threshold to determine if additional minimization is desired. If the system performing process 400 determines that additional minimization is desired, then the system can select parameters for reduced smoothing at 425 and return to smooth the cost function using those selected parameters at 410.

If the system performing process 400 determines that additional minimization is not desired, then the system can output the location displacement at 430, making it available for reducing the image distortions using the forward and reverse gradient images.

Experimental Results

The EPI images presented herein were acquired with a spin-echo EPI pulse sequence using standard 1.5T and 3T MRI tomographs. Perturbation of the cost function, as described in Equation 8, were performed using Bi-CGSTAB.

Figure 5:
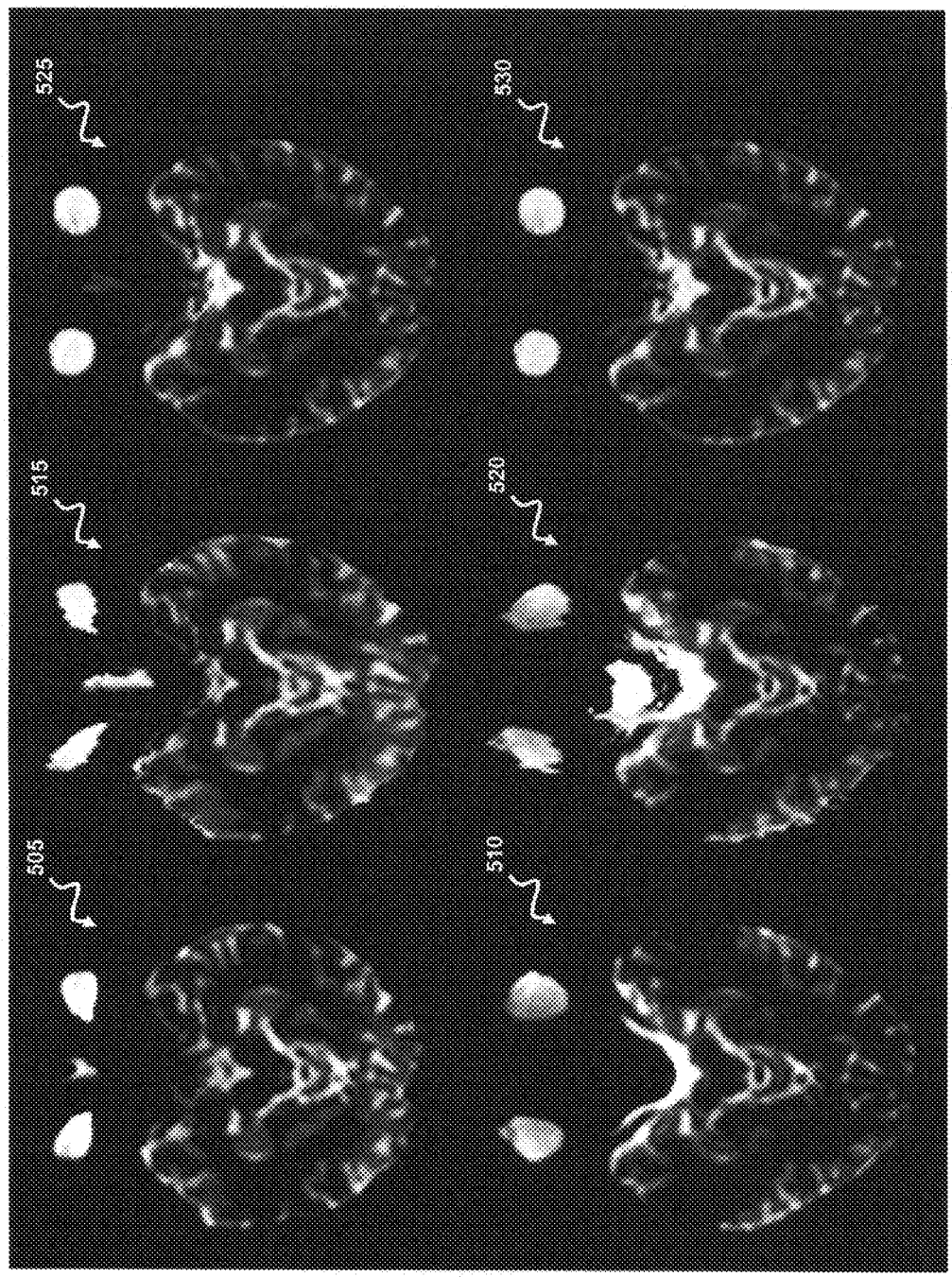
FIGS. 5-7 are collections of various MRI images.

FIG. 5 shows a collection of 3T EPI images 505, 510, 515, 520, 525, 530. Images 505, 510 are axial slices from forward and reverse gradient images. Images 505, 510 were acquired using gradients of the same magnitude but opposite direction. Images 515, 520 are the result of reducing distortion in images 505, 510 using a standard field map method. Images 525, 530 are the result of reducing distortion in images 505, 510 using an implementation of the systems and techniques described herein.

Figure 6:
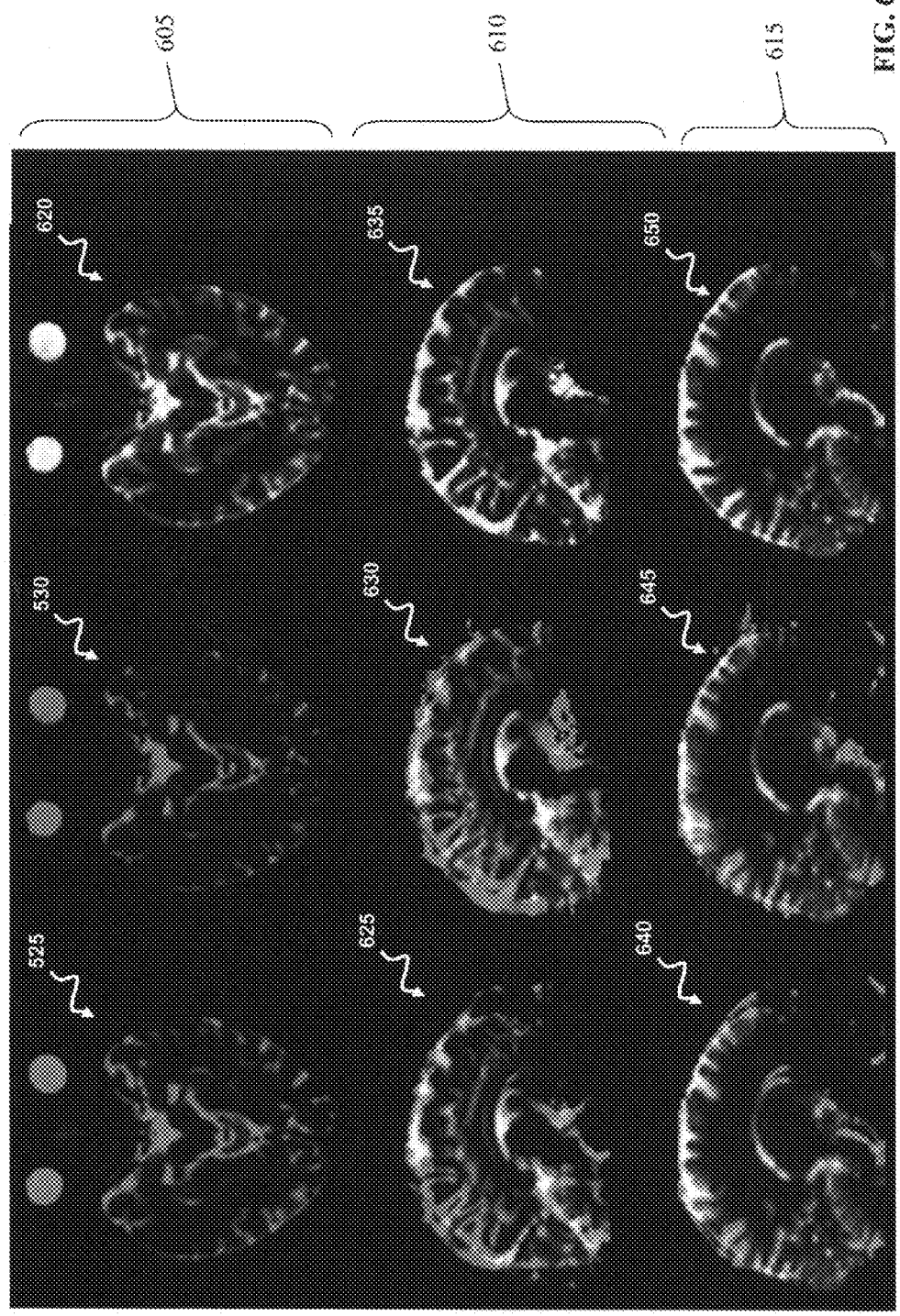

To highlight the effectiveness of the described systems and techniques, FIG. 6 shows a collection of 3T EPI images using complementary color overlays in rows 605, 610, 615. Top row 605 includes a copy of image 525 (albeit in blue), a copy of image 530 (albeit in red), and an image 620. Image 620 is the overlay of image 525 and image 530. Since images 525, 530 were treated using an implementation of the systems and techniques described herein, their generally white overlay in image 620 implies that the image distortions in images 505, 510 have been reduced in images 525, 530.

Middle row 610 includes sagittal images 625, 630, 635. Image 625 is the overlay of raw forward (red) and reverse (cyan) 3T EPI sagittal images. As can be seen, the visible red and cyan color implies that that these images are distorted. Image 630 is the overlay of field map corrected forward (red) and reverse (cyan) 3T EPI sagittal images. As can be seen, the visible red and cyan color implies that that these images also remain distorted despite field map correction. Image 635 is the overlay of forward (red) and reverse (cyan) 3T EPI sagittal images treated using an implementation of the systems and techniques described herein. As can be seen, their generally white overlay in image 635 implies that the image distortions have been reduced.

Bottom row 615 includes sagittal images 640, 645, 650. Image 640 is the overlay of raw forward (red) and reverse (cyan) 1.5T EPI sagittal images. As can be seen, the visible red and cyan color implies that that these images are distorted even at this lower field. Image 645 is the overlay of field map corrected forward (red) and reverse (cyan) 1.5T EPI sagittal images. As can be seen, the visible red and cyan color implies that that these images also remain distorted despite field map correction even at this lower field. Image 650 is the overlay of forward (red) and reverse (cyan) 1.5T EPI sagittal images treated using an implementation of the systems and techniques described herein. As can be seen, their generally white overlay in image 650 implies that the image distortions have been reduced.

Figure 7:
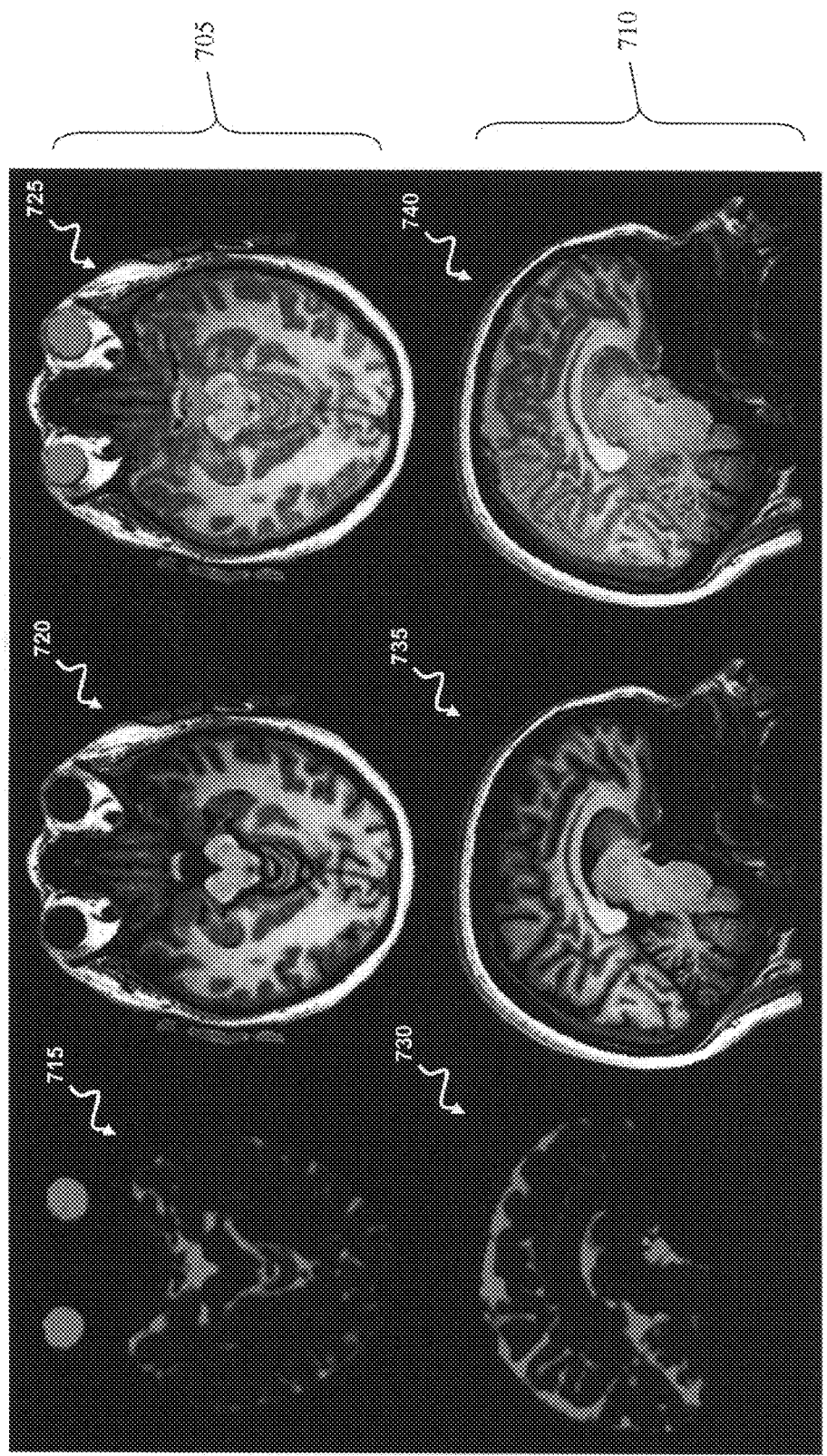

FIG. 7 shows a collection of MRI images in rows 705, 710. Top row 705 includes a collection of axial images 715, 720, 725. Image 715 is the average of a forward gradient 3T EPI image and a reverse gradient 3T EPI image that were treated using the systems and techniques described herein. Image 720 is a 3T T1-structural image of the same subject. Image 725 is the overlay of image 715 and image 720. As can be seen, there is good overlay between images 715, 720 and the average treated 3T EPI image is in agreement with the 3T T1-structural images.

Bottom row 710 includes a collection of sagittal images 730, 735, 740. Image 730 is the average of a forward gradient 3T EPI image and a reverse gradient 3T EPI image that were treated using the systems and techniques described herein. Image 735 is a 3T T1-structural image of the same subject. Image 740 is the overlay of image 730 and image 735. As can be seen, there is good overlay between images 730, 735 and the average treated 3T EPI image is in agreement with the 3T T1-structural images.

Implementations of the systems and techniques described herein can be realized in digital electronic circuitry, or in computer software, firmware, or hardware, including the structures disclosed in this specification and their structural equivalents, or in combinations of one or more of them. Implementations of the systems and techniques described herein can be realized as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the systems and techniques described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the systems and techniques described herein can be realized in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While many specifics are described, these should not be construed as limitations on the scope of the invention or of what may be claimed, but rather as descriptions of features specific to particular implementations. Certain features that are described herein in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made. For example, MRI images in which corresponding voxels are identified need not be distorted using exactly opposite gradients. Rather, for example, a collection of differently-distorted MRI images can be used, the displacement field scaled appropriately, and meaningful results obtained. Accordingly, other implementations are within the scope of the following claims.

ANNEX A

```
////////////////////////////////////////////////////////////////////////////
//
// Cost function  f == f(dispy),  dispy == (dispy1,...,dispyN).
//
// Calculate dfddispyi == partialDf/partialDdispyi,  0 <= i < numVox == N.
//
// Point Pj == (xj,yj,zj), i.e., voxel coordinate. Let this have voxel index j:  Pj <==> j.
//
// Consider point  Pjp  == (xj,yjp,zj)  ==  Pj + (0, dispy(Pj), 0)  ==  (xj, yj+dispy(Pj), zj)
```

```
/*
    COULD HAVE:

(1)
    const float widtha ( voxStep );              // Original width of all voxels.
    WITH
        float widthb1y  ( widtha+( dyp-dym)*voxStepInv/2.0 );   // New width of current
voxel, y, in vol1.
        float widthb2y  ( widtha+(-dyp+dym)*voxStepInv/2.0 );   // New width of current
voxel, y, in vol2.
        ETC

INSTEAD OF:

(2)
    const float widtha ( 2*voxStep );            // Original width around all voxels.
    WITH
        float widthb1y  ( widtha+2*( dyp-dym)*voxStepInv/2.0 );  // New width around
current voxel, y, in vol1.
        float widthb2y  ( widtha+2*(-dyp+dym)*voxStepInv/2.0 );  // New width around
current voxel, y, in vol2.
        ETC TO USE (1), SHOULD HAVE
    dwidthb1yddyp  ( voxStepInv/2.0 );
    ETC.

TO USE (2), SHOULD HAVE
    dwidthb1yddyp  ( voxStepInv );
    ETC.
```

CURRENTLY, (2) FUNCTIONS CORRECTLY IN THIS CODE. TO IMPLEMENT (1), NEED TO HALVE THE DERIVATIVES dwidthb1yddyp, ETC.
*/

```
//float voxStepInv ( 1.0/voxStep );        // == dwidthbdym = -dwidthbdyp.
//const float widtha ( 1.0 );              // Original width of all voxels.
const float widtha ( 2*voxStep );          // Original width of all voxels.
float widthb1y  ( widtha+2*( dyp-dym)*voxStepInv/2.0 );   // New width of current voxel, y, in vol1.
float widthb2y  ( widtha+2*(-dyp+dym)*voxStepInv/2.0 );   // New width of current voxel, y, in vol2.

float widthb1yp ( widtha+2*( dypp-dy)*voxStepInv/2.0 );   // New width of voxel yp in vol1.
float widthb2yp ( widtha+2*(-dypp+dy)*voxStepInv/2.0 );   // New width of voxel yp in vol2.

float widthb1ym ( widtha+2*( dy-dymm)*voxStepInv/2.0 );   // New width of voxel ym in vol1.
float widthb2ym ( widtha+2*(-dy+dymm)*voxStepInv/2.0 );   // New width of voxel ym in vol2.

// Can represent fabs(y(x)) as sqrt(SQR(y(x))) to see the role
// of the sign of y in the derivative of fabs(y(x)).
float signWidthb1y  ( (widthb1y >= 0.0) ? 1.0 : -1.0 );
float signWidthb2y  ( (widthb2y >= 0.0) ? 1.0 : -1.0 );
```

```
float signWidthb1yp   ( (widthb1yp >= 0.0) ? 1.0 : -1.0 );
float signWidthb2yp   ( (widthb2yp >= 0.0) ? 1.0 : -1.0 );

float signWidthb1ym   ( (widthb1ym >= 0.0) ? 1.0 : -1.0 );
float signWidthb2ym   ( (widthb2ym >= 0.0) ? 1.0 : -1.0 );

float dwidthb1yddyp   ( voxStepInv );

float dwidthb2yddyp   ( -voxStepInv );

float dwidthb1ypddy   ( -voxStepInv );
float dwidthb1ypddypp ( voxStepInv );

float dwidthb2ypddy   ( voxStepInv );
float dwidthb2ypddypp ( -voxStepInv );

float dwidthb1ymddy   ( voxStepInv );

float dwidthb2ymddy   ( -voxStepInv );

// fabs(widthb1y/widtha) gives the relative change in intensity due to local squishing or
expansion.
    float intensityCosty    ( fabs(widthb1y /widtha)*val1y    - fabs(widthb2y
/widtha)*val2y );
    float intensityCostym   ( fabs(widthb1ym/widtha)*val1ym   -
fabs(widthb2ym/widtha)*val2ym );
    float intensityCostyp   ( fabs(widthb1yp/widtha)*val1yp   -
fabs(widthb2yp/widtha)*val2yp );

float dIntensityCostyddy  ( fabs(widthb1y/widtha)*dl1ydpy   +
``` fabs(widthb2y/widtha)*dI2ydmy );

float dIntensityCostyddyp    ( signWidthb1y*(dwidthb1yddyp/widtha)*val1y  -  signWidthb2y*(dwidthb2yddyp/widtha)*val2y );

// 2nd deriv of of intensityCosty wrt dy, involving 2nd deriv of I1 (ddI1ydpydpy) and of I2 (ddI2ydmydmy).

float ddIntensityCostyddyddy  ( fabs(widthb1y/widtha)*ddI1ydpydpy    +  fabs(widthb2y/widtha)*ddI2ydmydmy );

float ddIntensityCostyddyddyp ( signWidthb1y*(dwidthb1yddyp/widtha)*dI1ydpy + signWidthb2y*(dwidthb2yddyp/widtha)*dI2ydmy );

float dIntensityCostypddy    ( signWidthb1yp*(dwidthb1ypddy/widtha)*val1yp  -  signWidthb2yp*(dwidthb2ypddy/widtha)*val2yp );

float dIntensityCostypddyp   ( fabs(widthb1yp/widtha)*dI1ypdpyp    +  fabs(widthb2yp/widtha)*dI2ypdmyp );

float dIntensityCostypddypp  ( signWidthb1yp*(dwidthb1ypddypp/widtha)*val1yp - signWidthb2yp*(dwidthb2ypddypp/widtha)*val2yp );

float ddIntensityCostypddyddyp (
signWidthb1yp*(dwidthb1ypddy/widtha)*dI1ypdpyp +
signWidthb2yp*(dwidthb2ypddy/widtha)*dI2ypdmyp );

float dIntensityCostymddy    ( signWidthb1ym*(dwidthb1ymddy/widtha)*val1ym  -  signWidthb2ym*(dwidthb2ymddy/widtha)*val2ym );

// y-term in merit function (ignoring smoothing part):
//float termy ( numVoxInv * intensityCosty * intensityCosty );

// 1st derivatve wrt dy of y-term in merit function (ignoring smoothing part):
float dtermyddy ( numVoxInv * 2.0 * intensityCosty * dIntensityCostyddy );

// derivative of (1st derivatve wrt dy of y-term in merit function (ignoring smoothing part)), i.e., relevant...

// 2nd derivatves of y-term in merit function (ignoring smoothing part):

float ddtermyddyddy   ( numVoxInv * 2.0 * ( dIntensityCostyddy * dIntensityCostyddy   +
            intensityCosty * ddIntensityCostyddyddy      ) );

float ddtermyddyddyp ( numVoxInv * 2.0 * ( intensityCosty   *  ddIntensityCostyddyddyp +
            dIntensityCostyddyp * dIntensityCostyddy      ) );

// ym-term in merit function (ignoring smoothing part):
//float termym ( numVoxInv * intensityCostym * intensityCostym );

// 1st derivatve wrt dy of ym-term in merit function (ignoring smoothing part):
float dtermymddy ( numVoxInv * 2.0 * intensityCostym * dIntensityCostymddy );

// derivative of (1st derivatve wrt dy of ym-term in merit function (ignoring smoothing part)), i.e., relevant...

// 2nd derivatves of ym-term in merit function (ignoring smoothing part):

float ddtermymddyddy   ( numVoxInv * 2.0 *  dIntensityCostymddy * dIntensityCostymddy     );

// yp-term in merit function (ignoring smoothing part):
//float termyp ( numVoxInv * intensityCostyp * intensityCostyp );

// 1st derivatve wrt dy of yp-term in merit function (ignoring smoothing part):
float dtermypddy ( numVoxInv * 2.0 * intensityCostyp * dIntensityCostypddy );

// derivative of (1st derivatve wrt dy of yp-term in merit function (ignoring smoothing part)), i.e., relevant...

// 2nd derivatves of yp-term in merit function (ignoring smoothing part):

float ddtermypddyddy ( numVoxInv * 2.0 * dIntensityCostypddy * dIntensityCostypddy );

float ddtermypddyddyp ( numVoxInv * 2.0 * ( intensityCostyp * ddIntensityCostypddyddyp + dIntensityCostypddyp * dIntensityCostypddy ) );

float ddtermypddyddypp ( numVoxInv * 2.0 * dIntensityCostypddypp * dIntensityCostypddy );

float dLambda1Termdy ( numVoxInv * 2.0 * lambda1 * dy );

// Load 1st derivative of merit function. Include 1st derivative wrt dy of "double scaleTerm( lambda1 * dy * dy );"

// Note: The lambda2 (and lambda2P) terms were already calculated and added above.

dcostddispy[voxelb] += dtermyddy + dtermymddy + dtermypddy + dLambda1Termdy;

// Load the second derivatives into arrays...note that the Hessian is symmetric.

Hjj [voxelb] = ddtermyddyddy + ddtermymddyddy + ddtermypddyddy; // == H[voxel][voxel] = d2M/dydy Hjjp [voxelb] = ddtermyddyddyp + ddtermypddyddyp;    // == H[voxel][voxelyp] = d2M/dydyp = d2M/dypdy Hjjpp[voxelb] = ddtermypddyddypp;    // == H[voxel][voxelypp] = d2M/dydypp = d2M/dyppdy // Note: the 2nd derivatives (a bunch of Kronecker deltas) of
// the smoothing term(s) in the cost function have yet to be
// included in the Hessian. Defer this little exercise to the
// maxtrix-vector multiplication routine (mult() below.) Also
// defer to mult() the inclusion of the 2nd derivative // (another Kronecker delta) of the scale (i.e., lambda1) term
// in the Hessian.
    }
}
undef SQR void mult( const Hessian& H, const double *v, double *w ) { // H * v = w int numVoxX ( H.numVoxX );
  int numVoxY ( H.numVoxY );
  int numVoxZ ( H.numVoxZ );

for(int xa = 0; xa < numVoxX; ++xa)
    for(int ya = 0; ya < numVoxY; ++ya)
      for(int za = 0; za < numVoxZ; ++za) { int voxel( xa*(numVoxY * numVoxZ) + ya*numVoxZ + za );

int  yam    ( (ya == 0 ? 0 : ya-1) );
        int  voxelym ( xa*(numVoxY * numVoxZ) + yam*numVoxZ + za );

int  yamm   ( (yam == 0 ? 0 : yam-1) );
        int  voxelymm( xa*(numVoxY * numVoxZ) + yamm*numVoxZ + za );

int  yap    ( (ya == numVoxY-1 ? numVoxY-1 : ya+1) );
        int  voxelyp ( xa*(numVoxY * numVoxZ) + yap*numVoxZ + za );

int  yapp   ( (yap == numVoxY-1 ? numVoxY-1 : yap+1) );
        int  voxelypp( xa*(numVoxY * numVoxZ) + yapp*numVoxZ + za );

```
int xam    ( (xa == 0 ? 0 : xa-1) );
int voxelxm ( xam*(numVoxY * numVoxZ) + ya*numVoxZ + za );

int xamm   ( (xam == 0 ? 0 : xam-1) );
int voxelxmm( xamm*(numVoxY * numVoxZ) + ya*numVoxZ + za );

int xap    ( (xa == numVoxX-1 ? numVoxX-1 : xa+1) );
int voxelxp ( xap*(numVoxY * numVoxZ) + ya*numVoxZ + za );

int xapp   ( (xap == numVoxX-1 ? numVoxX-1 : xap+1) );
int voxelxpp( xapp*(numVoxY * numVoxZ) + ya*numVoxZ + za );

int zam    ( (za == 0 ? 0 : za-1) );
int voxelzm ( xa*(numVoxY * numVoxZ) + ya*numVoxZ + zam );

int zamm   ( (zam == 0 ? 0 : zam-1) );
int voxelzmm( xa*(numVoxY * numVoxZ) + ya*numVoxZ + zamm );

int zap    ( (za == numVoxZ-1 ? numVoxZ-1 : za+1) );
int voxelzp ( xa*(numVoxY * numVoxZ) + ya*numVoxZ + zap );

int zapp   ( (zap == numVoxZ-1 ? numVoxZ-1 : zap+1) );
int voxelzpp( xa*(numVoxY * numVoxZ) + ya*numVoxZ + zapp );

w[voxel] = ( H.Hjjpp[voxelymm] * v[voxelymm] +
    H.Hjjp [voxelym ] * v[voxelym ] +
    H.Hjj  [voxel   ] * v[voxel   ] +
    H.Hjjp [voxel   ] * v[voxelyp ] +
    H.Hjjpp[voxel   ] * v[voxelypp] +
```

```
// double gradTerm = lambda2  * (gx*gx + gy*gy + gz*gz) )    [...This is the standard one]
//            + lambda2P * ((gxp*gxp+gxm*gxm) + (gyp*gyp+gym*gym) + (gzp*gzp+gzm*gzm));
        H.lamSize   * v[voxel] +
        H.lamSmooth * ( v[voxel  ] * 6.0 -
            v[voxelxmm] -
            v[voxelymm] -
            v[voxelzmm] -
            v[voxelxpp] -
            v[voxelypp] -
            v[voxelzpp]      ) +

H.lamSmoothP* ( v[voxel  ] * 12.0 -
            v[voxelxm] * 2.0 -
            v[voxelym] * 2.0 -
            v[voxelzm] * 2.0 -
            v[voxelxp] * 2.0 -
            v[voxelyp] * 2.0 -
            v[voxelzp] * 2.0  ));
    }
}
```

```
const int numVox    ( numVoxX*numVoxY*numVoxZ );
const int numVoxb   ( numVoxX*numVoxY*numVoxZb );

const double numVoxInv (1.0/numVox);

const float voxStepInv ( 1.0/voxStep );
const float dgwdw      ( 1.0/(2.0*voxStep) );

memset(dcostddispy, 0, numVoxb*sizeof(double));
memset(Hjj,         0, numVoxb*sizeof(double));
memset(Hjjp,        0, numVoxb*sizeof(double));
memset(Hjjpp,       0, numVoxb*sizeof(double));

for(int xa = 0; xa < numVoxX; ++xa)
 for(int ya = 0; ya < numVoxY; ++ya)
  for(int za = zaMin, zb = 0; za < zaMax; ++za, ++zb) { int voxel ( xa*(numVoxY * numVoxZ) + ya*numVoxZ + za );
   int voxelb( xa*(numVoxY * numVoxZb) + ya*numVoxZb + zb );

float x  ( xa*voxStep );
   float y  ( ya*voxStep );
   float z  ( za*voxStep );
   float dy ( dispy[voxel] );

int   yam     ( (ya == 0 ? 0 : ya-1) );
   int   voxelym ( xa*(numVoxY * numVoxZ) + yam*numVoxZ + za );
   int   voxelbym( xa*(numVoxY * numVoxZb) + yam*numVoxZb + zb );
   float dym     ( dispy[voxelym] );
   float ym      ( yam*voxStep );
```

```
int   yap     ( (ya == numVoxY-1 ? numVoxY-1 : ya+1) );
int   voxelyp ( xa*(numVoxY * numVoxZ) + yap*numVoxZ + za );
int   voxelbyp( xa*(numVoxY * numVoxZb) + yap*numVoxZb + zb );
float dyp     ( dispy[voxelyp] );
float yp      ( yap*voxStep );

float gy      ( (dyp - dym)/(2.0*voxStep) );
float gyp     ( (dyp - dy )/(2.0*voxStep) );
float gym     ( (dy  - dym)/(2.0*voxStep) );
//float ggyp   ( gyp*gyp );
//float ggym   ( gym*gym );

int   yamm    ( (yam == 0 ? 0 : yam-1) );
int   voxelymm( xa*(numVoxY * numVoxZ) + yamm*numVoxZ + za );
float dymm    ( dispy[voxelymm] );

int   yapp    ( (yap == numVoxY-1 ? numVoxY-1 : yap+1) );
int   voxelypp( xa*(numVoxY * numVoxZ) + yapp*numVoxZ + za );
float dypp    ( dispy[voxelypp] );
//float gyp    ( (dypp - dy )/(2.0*voxStep) );
//float gym    ( (dy   - dymm)/(2.0*voxStep) );

int   xam     ( (xa == 0 ? 0 : xa-1) );
int   voxelxm ( xam*(numVoxY * numVoxZ) + ya*numVoxZ + za );
int   voxelbxm( xam*(numVoxY * numVoxZb) + ya*numVoxZb + zb );
float dxm     ( dispy[voxelxm] );

int   xap     ( (xa == numVoxX-1 ? numVoxX-1 : xa+1) );
int   voxelxp ( xap*(numVoxY * numVoxZ) + ya*numVoxZ + za );
```

```
int   voxelbxp( xap*(numVoxY * numVoxZb) + ya*numVoxZb + zb );
float dxp    ( dispy[voxelxp] );

float gx     ( (dxp - dxm)/(2.0*voxStep) );
float gxp    ( (dxp - dy )/(2.0*voxStep) );
float gxm    ( (dy  - dxm)/(2.0*voxStep) );
//float ggxp  ( gxp*gxp );
//float ggxm  ( gxm*gxm );

int   zam    ( (za == 0 ? 0 : za-1) );
int   zbm    ( (zb == 0 ? 0 : zb-1) );
int   voxelzm ( xa*(numVoxY * numVoxZ) + ya*numVoxZ  + zam );
int   voxelbzm( xa*(numVoxY * numVoxZb) + ya*numVoxZb + zbm );
float dzm    ( dispy[voxelzm] );

int   zap    ( (za == numVoxZ -1 ? numVoxZ -1 : za+1) );
int   zbp    ( (zb == numVoxZb-1 ? numVoxZb-1 : zb+1) );
int   voxelzp ( xa*(numVoxY * numVoxZ) + ya*numVoxZ  + zap );
int   voxelbzp( xa*(numVoxY * numVoxZb) + ya*numVoxZb + zbp );
float dzp    ( dispy[voxelzp] );

float gz     ( (dzp - dzm)/(2.0*voxStep) );
float gzp    ( (dzp - dy )/(2.0*voxStep) );
float gzm    ( (dy  - dzm)/(2.0*voxStep) );
//float ggzp  ( gzp*gzp );
//float ggzm  ( gzm*gzm );

// double gradTerm ( lambda2 * (gx*gx + gy*gy + gz*gz) ); This is the standard one.
dcostddispy[voxelbxm] += numVoxInv * 2.0 * lambda2 * gx * (-dgwdw); // ==
``` dGradTerm/d(dxm)

dcostddispy[voxelbxp] += numVoxInv * 2.0 * lambda2 * gx * ( dgwdw); // == dGradTerm/d(dxp)

dcostddispy[voxelbym] += numVoxInv * 2.0 * lambda2 * gy * (-dgwdw); // Etc.

dcostddispy[voxelbyp] += numVoxInv * 2.0 * lambda2 * gy * ( dgwdw);

dcostddispy[voxelbzm] += numVoxInv * 2.0 * lambda2 * gz * (-dgwdw);

dcostddispy[voxelbzp] += numVoxInv * 2.0 * lambda2 * gz * ( dgwdw);

// CAN COMBINE THE ABOVE WITH THE FOLLOWING.

// OR USE EITHER THE ABOVE OR THE FOLLOWING.

// See aslo mult() in solveHessian().

//double gradTerm = lambda2P * ((gxp*gxp+gxm*gxm) + (gyp*gyp+gym*gym) + (gzp*gzp+gzm*gzm));

dcostddispy[voxelb] = numVoxInv * 2.0*lambda2P*( 1.0/(2.0*voxStep) )*( 2.0*gxm - 2.0*gxp +

2.0*gym - 2.0*gyp +

2.0*gzm - 2.0*gzp );    // == d(GradTerm)/d(dy)

// Gradient, wrt minimization parameters, of main merit term

// in cost function.

Real val1y (0.0);

if(x > -1 && y+dy > -1 && z > -1 && x < width && y+dy < height && z < depth)

MRIsampleVolumeFrameType(vol1Mri, x, y+dy, z, 0, SAMPLE_TRILINEAR, &val1y);

Real val2y (0.0);

if(x > -1 && y-dy > -1 && z > -1 && x < width && y-dy < height && z < depth)

```
    MRIsampleVolumeFrameType(vol2Mri, x, y-dy, z, 0, SAMPLE_TRILINEAR,
&val2y);

Real val1y_hp (0.0);
  if(x > -1 && y+dy+h > -1 && z > -1 && x < width && y+dy+h < height && z <
depth)
      MRIsampleVolumeFrameType(vol1Mri, x, y+dy+h, z, 0, SAMPLE_TRILINEAR,
&val1y_hp);
  Real val1y_hm (0.0);
  if(x > -1 && y+dy-h > -1 && z > -1 && x < width && y+dy-h < height && z <
depth)
      MRIsampleVolumeFrameType(vol1Mri, x, y+dy-h, z, 0, SAMPLE_TRILINEAR,
&val1y_hm);
  float dI1ydpy ( (val1y_hp - val1y_hm)/(2.0*h) );

Real val2y_hp (0.0);
  if(x > -1 && y-dy+h > -1 && z > -1 && x < width && y-dy+h < height && z <
depth)
      MRIsampleVolumeFrameType(vol2Mri, x, y-dy+h, z, 0, SAMPLE_TRILINEAR,
&val2y_hp);
  Real val2y_hm (0.0);
  if(x > -1 && y-dy-h > -1 && z > -1 && x < width && y-dy-h < height && z <
depth)
      MRIsampleVolumeFrameType(vol2Mri, x, y-dy-h, z, 0, SAMPLE_TRILINEAR,
&val2y_hm);
  float dI2ydmy ( (val2y_hp - val2y_hm)/(2.0*h) );

//Calculate gradient of I1 wrt dy at y+dy+h (dI1yhpdpy), and at y+dy-h (dI1yhmdpy)
  //so as to calculate the 2nd derivative if I1 at y+dy, i.e.,
  //ddI1ydpydpy = (dI1yhpdpy - dI1yhmdpy)/(2.0*h).
```

```
Real val1yhp_hp (0.0);
if(x > -1 && y+dy+2.0*h > -1 && z > -1 && x < width && y+dy+2.0*h < height
&& z < depth)
    MRIsampleVolumeFrameType(vol1Mri, x, y+dy+2.0*h, z, 0,
SAMPLE_TRILINEAR, &val1yhp_hp);
Real val1yhp_hm (val1y);
float dI1yhpdpy ( (val1yhp_hp - val1yhp_hm)/(2.0*h) );

Real val1yhm_hp (val1y);
Real val1yhm_hm (0.0);
if(x > -1 && y+dy-2.0*h > -1 && z > -1 && x < width && y+dy-2.0*h < height &&
z < depth)
    MRIsampleVolumeFrameType(vol1Mri, x, y+dy-2.0*h, z, 0,
SAMPLE_TRILINEAR, &val1yhm_hm);
float dI1yhmdpy ( (val1yhm_hp - val1yhm_hm)/(2.0*h) );

float ddI1ydpydpy ( (dI1yhpdpy - dI1yhmdpy)/(2.0*h) );

//Calculate gradient of I2 wrt dy at y-dy+h (dI2yhpdmy), and at y-dy-h (dI2yhmdmy)
//so as to calculate the 2nd derivative if I2 at y-dy, i.e.,
//ddI2ydmydmy = (dI2yhpdmy - dI2yhmdmy)/(2.0*h).
Real val2yhp_hp (0.0);
if(x > -1 && y-dy+2.0*h > -1 && z > -1 && x < width && y-dy+2.0*h < height &&
z < depth)
    MRIsampleVolumeFrameType(vol2Mri, x, y-dy+2.0*h, z, 0,
SAMPLE_TRILINEAR, &val2yhp_hp);
Real val2yhp_hm (val2y);
float dI2yhpdmy ( (val2yhp_hp - val2yhp_hm)/(2.0*h) );

Real val2yhm_hp (val2y);
```

```
Real val2yhm_hm (0.0);
if(x > -1 && y-dy-2.0*h > -1 && z > -1 && x < width && y-dy-2.0*h < height && z < depth)
    MRIsampleVolumeFrameType(vol2Mri, x, y-dy-2.0*h, z, 0, SAMPLE_TRILINEAR, &val2yhm_hm);
float dI2yhmdmy ( (val2yhm_hp - val2yhm_hm)/(2.0*h) );

float ddI2ydmydmy ( (dI2yhpdmy - dI2yhmdmy)/(2.0*h) );

Real val1yp (0.0);
if(x > -1 && yp+dyp > -1 && z > -1 && x < width && yp+dyp < height && z < depth)
    MRIsampleVolumeFrameType(vol1Mri, x, yp+dyp, z, 0, SAMPLE_TRILINEAR, &val1yp);

Real val2yp (0.0);
if(x > -1 && yp-dyp > -1 && z > -1 && x < width && yp-dyp < height && z < depth)
    MRIsampleVolumeFrameType(vol2Mri, x, yp-dyp, z, 0, SAMPLE_TRILINEAR, &val2yp);

Real val1yp_hp (0.0);
if(x > -1 && yp+dyp+h > -1 && z > -1 && x < width && yp+dyp+h < height && z < depth)
    MRIsampleVolumeFrameType(vol1Mri, x, yp+dyp+h, z, 0, SAMPLE_TRILINEAR, &val1yp_hp);
Real val1yp_hm (0.0);
if(x > -1 && yp+dyp-h > -1 && z > -1 && x < width && yp+dyp-h < height && z < depth)
```

MRIsampleVolumeFrameType(vol1Mri, x, yp+dyp-h, z, 0, SAMPLE_TRILINEAR, &val1yp_hm);

float dI1ypdpyp ( (val1yp_hp - val1yp_hm)/(2.0*h) );

Real val2yp_hp (0.0);
if(x > -1 && yp-dyp+h > -1 && z > -1 && x < width && yp-dyp+h < height && z < depth)

MRIsampleVolumeFrameType(vol2Mri, x, yp-dyp+h, z, 0, SAMPLE_TRILINEAR, &val2yp_hp);

Real val2yp_hm (0.0);
if(x > -1 && yp-dyp-h > -1 && z > -1 && x < width && yp-dyp-h < height && z < depth)

MRIsampleVolumeFrameType(vol2Mri, x, yp-dyp-h, z, 0, SAMPLE_TRILINEAR, &val2yp_hm);

float dI2ypdmyp ( (val2yp_hp - val2yp_hm)/(2.0*h) );

Real val1ym (0.0);
if(x > -1 && ym+dym > -1 && z > -1 && x < width && ym+dym < height && z < depth)

MRIsampleVolumeFrameType(vol1Mri, x, ym+dym, z, 0, SAMPLE_TRILINEAR, &val1ym);

Real val2ym (0.0);
if(x > -1 && ym-dym > -1 && z > -1 && x < width && ym-dym < height && z < depth)

MRIsampleVolumeFrameType(vol2Mri, x, ym-dym, z, 0, SAMPLE_TRILINEAR, &val2ym);

endif

```
void
setupHessian(Hessian&    hessian,
        double*      dispy,
        const int&   voxStep,
        MRI*         vol1Mri,
        MRI*         vol2Mri,
        const int&   zaMin,
        const int&   zaMax,
        const double& lambda1,
        const double& lambda2,
        const double& lambda2P,
        const float& h) { double* dcostddispy (hessian.dcostddispy);
    double* Hjj      (hessian.Hjj);
    double* Hjjp     (hessian.Hjjp);
    double* Hjjpp    (hessian.Hjjpp);

const int width  (vol1Mri->width);
    const int height (vol1Mri->height);
    const int depth  (vol1Mri->depth);

const int numVoxX ( width  / voxStep + (width  % voxStep ? 1 : 0) );
    const int numVoxY ( height / voxStep + (height % voxStep ? 1 : 0) );
    const int numVoxZ ( depth  / voxStep + (depth  % voxStep ? 1 : 0) );
    const int numVoxZb( zaMax - zaMin );
```

```
// -------  =  ---------------------------------------------,
// dyjp              2h
//
// dI2(Pjm)    I2(xj, yj-dispy(Pj)+h, zj) - I2(xj, yj-dispy(Pj)-h, zj)
// -------  =  ---------------------------------------------,
// dyjm              2h
//
// where, e.g., h = 1.0 (1.0 ==> length of side of a voxel, or some fraction or multiple of this).
//
// So,
//
// dfddispyi  ==   2*(I1(Pip) - I2(Pim) ) * ( (dI1(Pip)/dyip) + (dI2(Pim)/dyim) ).
//
//
/////////////////////////////////////////////////////////////////////////////// include <iostream> include <cmath>         // for fabs().
include <cstring>       // for memset()

#include "hessian.h"

extern "C" {
#include "fsStuff.h"     // MRI struct
} ifndef SQR
define SQR(a)  ((a)*(a))
```

```
// and point Pjm == (xj,yjp,zj) == Pj - (0, dispy(Pj), 0) == (xj, yj-dispy(Pj), zj)
//
// i.e., yjp = yj + dispy(Pj),
// i.e., yjm = yj - dispy(Pj),
//
// I1(Pjp) is intensity at point Pjp in volume1,
// I2(Pjm) is intensity at point Pjm in volume2.
//
// f(dispy) == SUM_(xj,yj,zj) { SQR( I1(Pjp) - I2(Pjm) ) }, suitably avoiding the boundary values of (xj,yj,zj).
//
// This is the cost function, where SUM_(xj,yj,zj) == SUM_Pj == SUM_j,
// voxel coords (xj,yj,zj) correspond to index j: Pj <==> (xj,yj,zj) <==> j; dispy(Pj) == dispy[j].
//
// Pjp = Pj + dispy[j] y^;  yjp = yj + dispy[j];
// Pjm = Pj - dispy[j] y^;  yjm = yj - dispy[j];
//
// Let index i corespond to any voxel.
// dispyi == dispy[i], 0 <= i < numVox.
//
// dfddispyi == SUM_Pj{ 2*(I1(Pjp) - I2(Pjm) ) * ( (dI1(Pjp)/dyjp)*(dyjp/ddispyi) - (dI2(Pjm)/dyjm)*(dyjm/ddispyi) ) }.
//
// But
//
// dyjp/ddispyi =  KroneckerDelta_ij,
// dyjm/ddispyi = -KroneckerDelta_ij,
//
// dI1(Pjp)   I1(xj, yj+dispy(Pj)+h, zj) - I1(xj, yj+dispy(Pj)-h, zj)
```

What is claimed is:

1. A machine-implemented method for reducing image distortion in magnetic resonance imaging (MRI), comprising:
   receiving a first MRI image and a second MRI image, wherein the first MRI image and the second MRI image were acquired using different gradient fields;
   estimating displacements of voxels between the first MRI image and the second MRI image by minimizing a cost function expressing a cost of the displacements;
   reducing distortion in an MRI image using the estimated displacements; and
   making the MRI image having reduced distortion available.

2. The method of claim 1, wherein estimating the displacements of the voxels comprises iteratively minimizing a collection of cost functions expressing costs of displacements of different versions of the first MRI image and the second MRI image, wherein the different versions have been smoothed to different extents.

3. The method of claim 1, wherein estimating the displacements of the voxels comprises:
   producing a Hessian of the cost function; and
   perturbing the Hessian of the cost function around a current estimate of the displacements using sparse matrix techniques.

4. The method of claim 1, wherein estimating the displacements of the voxels comprises minimizing $$F(u_1, \ldots, u_N) = \frac{1}{N} \sum_{i=1}^{N} [J_{1i} I_1(\vec{r} + u_i \hat{y}) - J_{2i} I_2(\vec{r} - u_i \hat{y})]^2 + \lambda_1 \sum_{i=1}^{N} u_i^2 + \lambda_2 \sum_{i=1}^{N} [\vec{\nabla}_i u_i]^2.$$

5. The method of claim 1, wherein reducing the distortion in the MRI image comprises reducing the distortion in the first MRI image or in the second MRI image.

6. The method of claim 1, wherein making the MRI image having reduced distortion available comprises physically transforming a display screen to display the MRI image having reduced distortion or physically transforming a memory element in a data storage device to store data describing the MRI image having reduced distortion.

7. The method of claim 1, wherein the cost function comprises:
   a data term that that reflects a match between predicted and observed values of voxel coordinates; and
   a regularization part that reflects the physical properties of a magnetic field.

8. An article comprising one or more non-transitory machine-readable media storing instructions operable to cause one or more machines to perform operations, the operations comprising:
   estimating displacements of voxels between a forward gradient MRI image and a reverse gradient MRI image by finding an extremum of an expression that is a function of the displacements.

9. The article of claim 8, finding the extremum comprises using sparse matrix techniques.

10. The article of claim 8, wherein finding the extremum comprises perturbing a Hessian of a cost function that expresses a cost of the displacements of the voxels.

11. The article of claim 9, wherein perturbing the Hessian of the cost function comprises perturbing the Hessian of quadratic approximation of the cost function.

12. The article of claim 8, wherein estimating the displacements of the voxels comprises smoothing the forward gradient MRI image and the reverse gradient MRI image to reduce high spatial frequency content.

13. The article of claim 12, wherein the expression comprises a function of the displacements of the voxels between the smoothed forward gradient MRI image and the smoothed reverse gradient MRI image.

14. The article of claim 12, wherein the expression comprises:

$$H(\vec{u}) \cdot \vec{v} = -\vec{g}(\vec{u}),$$

where
$H(\vec{u})$ is the Hessian of a cost function at $\vec{u}$, and
$\vec{g}(\vec{u})$ is the gradient of the cost function at $\vec{u}$.

15. A machine-implemented method comprising:
   smoothing MRI images to yield first smoothed MRI images;
   expressing a cost of displacements of voxels in the first smoothed MRI images in a first expression;
   perturbing the first expression to yield a first approximation of the displacements of the voxels;
   smoothing the MRI images to yield second smoothed MRI images, wherein the second smoothed MRI images include higher spatial frequency content than the first smoothed MRI images;
   expressing a cost of the displacements of voxels in the second smoothed MRI images in a second expression; and
   perturbing the second expression about the first approximation to yield a second approximation of the displacements of the voxels.

16. A machine-implemented method for magnetic resonance imaging (MRI), comprising:
   using data from acquired raw MRI images with opposite-gradient magnetic fields to construct a cost function for an MRI displacement field caused by applied magnetic fields in acquiring the raw MRI images, the cost function comprising: (1) a term involving the voxel-by-voxel difference of image intensities, which are scaled by the local dilation; (2) a term to keep the MRI displacement field smooth over the whole volume; and (3) a scale term for the MRI displacement field; and
   minimizing the cost function to extract correct MRI displacement for each voxel.

17. The method of claim 16, comprising:
   using the MRI displacement field to construct an MRI image with reduced image distortions.

18. The method of claim 16, wherein minimizing of the cost function comprises:
   applying a convolution processing to smooth the images;
   applying Newton's method to the cost function of the smoothed images to construct a matrix equation as the Hessian of the cost function; and processing the matrix equation to find a solution for the MRI displacement field which corrects the distortions and aligns the images) at a current level of smoothing.

19. The method of claim 16, further comprising:
iterating the minimizing of the cost function at different levels of smoothing to obtain the displacement field.

20. A magnetic resonance imaging system comprising:
a scanner configured to acquire a first MRI image and a second MRI image using different gradient fields; and
a data processing apparatus configured to:
receive the first MRI image and the second MRI image;
estimate displacements of voxels between the first MRI image and the second MRI image by minimizing a cost function expressing a cost of the displacements; and
reduce distortion in an MRI image using the estimated displacements.

* * * * *